United States Patent
Yang et al.

(10) Patent No.: US 11,044,719 B2
(45) Date of Patent: Jun. 22, 2021

(54) COMPACT DCI FOR URLLC

(71) Applicant: QUALCOMM Incorporated, San Diego, CA (US)

(72) Inventors: Wei Yang, San Diego, CA (US); Wanshi Chen, San Diego, CA (US); Seyedkianoush Hosseini, San Diego, CA (US); Jing Jiang, San Diego, CA (US); Chih-Ping Li, San Diego, CA (US); Tingfang Ji, San Diego, CA (US); Linhai He, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/809,382

(22) Filed: Mar. 4, 2020

(65) Prior Publication Data

US 2020/0275421 A1    Aug. 27, 2020

Related U.S. Application Data

(63) Continuation of application No. 16/374,488, filed on Apr. 3, 2019.

(60) Provisional application No. 62/653,424, filed on Apr. 5, 2018.

(51) Int. Cl.
*H04W 72/04* (2009.01)

(52) U.S. Cl.
CPC ................ *H04W 72/042* (2013.01)

(58) Field of Classification Search
None
See application file for complete search history.

(56) References Cited

U.S. PATENT DOCUMENTS

| | | | | |
|---|---|---|---|---|
| 2012/0044921 A1* | 2/2012 | Chung | ................... | H04L 5/0053 370/338 |
| 2012/0307778 A1* | 12/2012 | Nishio | ................... | H04L 5/0053 370/329 |
| 2012/0320840 A1* | 12/2012 | Kim | ........................ | H04L 5/001 370/329 |

(Continued)

FOREIGN PATENT DOCUMENTS

EP    2472741 A1    7/2012

OTHER PUBLICATIONS

Panteleev. U.S. Appl. No. 62/710,411, filed Feb. 16, 2018. (Year: 2018).*

(Continued)

*Primary Examiner* — Andre Tacdiran
(74) *Attorney, Agent, or Firm* — Patterson & Sheridan, L.L.P.

(57) ABSTRACT

Certain aspects of the present disclosure provide techniques for compact downlink control information (DCI) signaling design for ultra-reliable low-latency communications (URLLC). A method for wireless communications performed by a base station (BS) is provided. The method generally includes generating DCI, the DCI scheduling at least one transmission, according to a first DCI format. The first DCI format is compressed relative to a second DCI format and includes a carrier indicator field (CIF) and/or a rate-matching indicator field. The BS transmits the DCI to a user equipment (UE). The UE communicates with the BS based on the received DCI.

28 Claims, 14 Drawing Sheets

(56) References Cited

U.S. PATENT DOCUMENTS

| | | | |
|---|---|---|---|
| 2013/0010709 A1* | 1/2013 | Earnshaw | H04L 5/0091 370/329 |
| 2013/0044711 A1 | 2/2013 | Aiba et al. | |
| 2013/0070690 A1* | 3/2013 | Moon | H04L 5/0053 370/329 |
| 2013/0107836 A1 | 5/2013 | Miki et al. | |
| 2013/0142142 A1 | 6/2013 | McBeath et al. | |
| 2013/0188516 A1* | 7/2013 | He | H04B 17/318 370/254 |
| 2013/0294273 A1 | 11/2013 | Lunttila et al. | |
| 2014/0003356 A1* | 1/2014 | Wang | H04L 5/001 370/329 |
| 2014/0064135 A1* | 3/2014 | Chen | H04W 76/27 370/253 |
| 2014/0348038 A1 | 11/2014 | Takeda et al. | |
| 2014/0376457 A1 | 12/2014 | Feng et al. | |
| 2015/0110032 A1* | 4/2015 | Nagata | H04W 72/042 370/329 |
| 2015/0117291 A1 | 4/2015 | Seo et al. | |
| 2015/0131536 A1* | 5/2015 | Kaur | H04L 5/0055 370/329 |
| 2015/0131579 A1* | 5/2015 | Li | H04L 1/1858 370/329 |
| 2015/0223254 A1* | 8/2015 | Guo | H04W 72/0493 370/312 |
| 2015/0341949 A1* | 11/2015 | Nagata | H04L 1/0013 370/329 |
| 2016/0165640 A1 | 6/2016 | Yang et al. | |
| 2016/0183223 A1* | 6/2016 | Park | H04L 5/0028 370/329 |
| 2016/0227486 A1 | 8/2016 | Park | |
| 2016/0227524 A1* | 8/2016 | Choi | H04L 5/0053 |
| 2016/0353440 A1* | 12/2016 | Lee | H04W 72/0453 |
| 2017/0094528 A1* | 3/2017 | Takeda | H04W 72/042 |
| 2017/0332359 A1 | 11/2017 | Tsai et al. | |
| 2018/0014291 A1* | 1/2018 | Takeda | H04W 72/044 |
| 2018/0019794 A1* | 1/2018 | Kowalski | H04W 52/346 |
| 2018/0049189 A1 | 2/2018 | Hugl et al. | |
| 2019/0068423 A1 | 2/2019 | Hwang et al. | |
| 2019/0149365 A1 | 5/2019 | Chatterjee et al. | |
| 2019/0182807 A1* | 6/2019 | Panteleev | H04L 1/1819 |
| 2019/0182859 A1* | 6/2019 | Khoryaev | H04L 1/0013 |
| 2019/0222400 A1* | 7/2019 | Bagheri | H04L 1/0068 |
| 2019/0274032 A1* | 9/2019 | Chatterjee | H04W 48/12 |
| 2019/0313385 A1 | 10/2019 | Yang et al. | |
| 2019/0349910 A1* | 11/2019 | Ma | H04L 1/0038 |
| 2019/0349960 A1 | 11/2019 | Li et al. | |
| 2020/0059331 A1 | 2/2020 | Wong et al. | |
| 2020/0077381 A1 | 3/2020 | Wallen et al. | |
| 2020/0213989 A1* | 7/2020 | Choi | H04W 72/0406 |
| 2020/0287654 A1* | 9/2020 | Xi | H04L 1/0057 |
| 2020/0374910 A1* | 11/2020 | Kim | H04L 5/00 |

OTHER PUBLICATIONS

3GPP TS 36.212 V10.8.0 (Jun. 2013) (Year: 2013).*
International Search Report and Written Opinion—PCT/US2019/025727—ISA/EPO—dated Jul. 8, 2019.

* cited by examiner

300

| DCI Format 1_1 | |
|---|---|
| Field | Bits |
| Identifier for DCI formats | 1 |
| Carrier Indicator | 0 or 3 |
| BWP Indicator | 0, 1, or 2 |
| Frequency domain resource assignment | variable |
| Time domain resource assignment | 0,1,2,3, or 4 |
| VRB-to-PRB mapping | 0 or 1 |
| PRB bundling size indicator | 0 or 1 |
| Rate matching indicator | 0, 1, or 2 |
| ZP CSI-RS trigger | 0, 1, or 2 |
| MCS | 5 |
| New data indicator | 1 |
| RV | 2 |
| HARQ process number | 4 |
| Downlink assignment index | 0, 2, or 4 |
| TPC command for scheduled PUCCH | 2 |
| PUCCH resource indicator | 3 |
| PDSCH-to-HARQ feedback timing indicator | 0, 1, 2, or 3 |
| Antenna port(s) | 4, 5, or 6 |
| TCI | 0 or 3 |
| SRS request | 2 |
| CBGTI | 0,2,4,6, or 8 |
| CBGFI | 0 or 1 |
| DMRS sequence initialization | 1 |

| DCI Format 1_0 | |
|---|---|
| Field | Bits |
| Identifier for DCI formats | 1 |
| ~~Carrier Indicator~~ | ~~0 or 3~~ |
| ~~BWP Indicator~~ | ~~0, 1, or 2~~ |
| Frequency domain resource assignment | variable |
| Random Access Preamble index | 1 |
| UL/SUL indicator | 1 |
| SS/PBCH index | 6 |
| PRACH Mask index | 4 |
| Reserved | 10 |
| ~~Time domain resource assignment~~ | ~~0, 1, 2, 3, or 4~~ |
| ~~VRB-to-PRB mapping~~ | ~~0 or 1~~ |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| ~~MCS~~ | ~~5~~ |
| ~~New data indicator~~ | ~~1~~ |
| ~~RV~~ | ~~2~~ |
| ~~HARQ process number~~ | ~~4~~ |
| ~~Downlink assignment index~~ | ~~0, 2, or 4~~ |
| ~~TPC command for scheduled PUCCH~~ | ~~2~~ |
| ~~PUCCH resource indicator~~ | ~~3~~ |
| ~~PDSCH-to-HARQ feedback timing indicator~~ | ~~0, 1, 2, or 3~~ |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |

| DCI Format 1_0 | |
|---|---|
| Field | Bits |
| Identifier for DCI formats | 1 |
| ~~Carrier Indicator~~ | ~~0 or 3~~ |
| ~~BWP Indicator~~ | ~~0, 1, or 2~~ |
| Frequency domain resource assignment | variable |
| Time domain resource assignment | 4 |
| VRB-to-PRB mapping | 1 |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| MCS | 5 |
| New data indicator | 1 |
| RV | 2 |
| HARQ process number | 4 |
| Downlink assignment index | 2 |
| TPC command for scheduled PUCCH | 2 |
| PUCCH resource indicator | 3 |
| PDSCH-to-HARQ feedback timing indicator | 0, 1, 2, or 3 |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |

| DCI Format 1_0 | |
|---|---|
| Field | Bits |
| Short Messages Indicator | 2 |
| Short Messages | 8 |
| ~~Identifier for DCI formats~~ | ~~1~~ |
| ~~Carrier Indicator~~ | ~~0 or 3~~ |
| ~~BWP Indicator~~ | ~~0, 1, or 2~~ |
| Frequency domain resource assignment | variable |
| Time domain resource assignment | 4 |
| VRB-to-PRB mapping | 1 |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| MCS | 5 |
| ~~New data indicator~~ | ~~1~~ |
| ~~RV~~ | ~~2~~ |
| ~~HARQ process number~~ | ~~4~~ |
| ~~Downlink assignment index~~ | ~~0, 2, or 4~~ |
| ~~TPC command for scheduled PUCCH~~ | ~~2~~ |
| ~~PUCCH resource indicator~~ | ~~3~~ |
| ~~PDSCH-to-HARQ feedback timing indicator~~ | ~~0, 1, 2, or 3~~ |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |
| TB scaling | 2 |
| Reserved | 6 |

| DCI Format 1_0 | |
|---|---|
| Field | Bits |
| ~~Identifier for DCI formats~~ | ~~1~~ |
| ~~Carrier Indicator~~ | ~~0 or 3~~ |
| ~~BWP Indicator~~ | ~~0, 1, or 2~~ |
| Frequency domain resource assignment | variable |
| Time domain resource assignment | 4 |
| VRB-to-PRB mapping | 1 |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| MCS | 5 |
| ~~New data indicator~~ | ~~1~~ |
| RV | 2 |
| ~~HARQ process number~~ | ~~4~~ |
| ~~Downlink assignment index~~ | ~~0, 2, or 4~~ |
| ~~TPC command for scheduled PUCCH~~ | ~~2~~ |
| ~~PUCCH resource indicator~~ | ~~3~~ |
| ~~PDSCH-to-HARQ feedback timing indicator~~ | ~~0, 1, 2, or 3~~ |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |
| <u>System information indicator</u> | <u>1</u> |
| <u>Reserved bits</u> | <u>15</u> |

| DCI Format 1_0 | |
|---|---|
| Field | Bits |
| ~~Identifier for DCI formats~~ | ~~1~~ |
| ~~Carrier Indicator~~ | ~~0 or 3~~ |
| ~~BWP Indicator~~ | ~~0, 1, or 2~~ |
| Frequency domain resource assignment | variable |
| Time domain resource assignment | 4 |
| VRB-to-PRB mapping | 1 |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| MCS | 5 |
| ~~New data indicator~~ | ~~1~~ |
| RV | 2 |
| ~~HARQ process number~~ | ~~4~~ |
| ~~Downlink assignment index~~ | ~~0, 2, or 4~~ |
| ~~TPC command for scheduled PUCCH~~ | ~~2~~ |
| ~~PUCCH resource indicator~~ | ~~3~~ |
| ~~PDSCH-to-HARQ feedback timing indicator~~ | ~~0, 1, 2, or 3~~ |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |
| <u>TB scaling</u> | <u>2</u> |
| <u>Reserved bits</u> | <u>16</u> |

| DCI Format 1_0 ||
|---|---|
| Field | Bits |
| Identifier for DCI formats | 1 |
| ~~Carrier Indicator~~ | ~~0 or 3~~ |
| ~~BWP Indicator~~ | ~~0, 1, or 2~~ |
| Frequency domain resource assignment | variable |
| Time domain resource assignment | 4 |
| VRB-to-PRB mapping | 0 or 1 |
| ~~PRB bundling size indicator~~ | ~~0 or 1~~ |
| ~~Rate matching indicator~~ | ~~0, 1, or 2~~ |
| ~~ZP CSI-RS trigger~~ | ~~0, 1, or 2~~ |
| MCS | 5 |
| New data indicator | 1 |
| RV | 2 |
| HARQ process number | 4 |
| Downlink assignment index | 0, 2, or 4 |
| TPC command for scheduled PUCCH | 2 |
| PUCCH resource indicator | 3 |
| PDSCH-to-HARQ feedback timing indicator | 0, 1, 2, or 3 |
| ~~Antenna port(s)~~ | ~~4, 5, or 6~~ |
| ~~TCI~~ | ~~0 or 3~~ |
| ~~SRS request~~ | ~~2~~ |
| ~~CBGTI~~ | ~~0, 2, 4, 6, or 8~~ |
| ~~CBGFI~~ | ~~0 or 1~~ |
| ~~DMRS sequence initialization~~ | ~~1~~ |

FIG. 4F

COMPACT DCI FOR URLLC

CROSS-REFERENCE TO RELATED APPLICATION(S)

This application is a Continuation of U.S. patent application Ser. No. 16/374,488, filed Apr. 3, 2019, and claims benefit of and priority to U.S. Provisional Patent Application Ser. No. 62/653,424, filed Apr. 5, 2018, herein incorporated by reference in their entirety as if fully set forth below and for all applicable purposes.

BACKGROUND

Field of the Disclosure

Aspects of the present disclosure relate to wireless communications, and more particularly, to techniques for compact downlink control information (DCI) signaling design for ultra-reliable low-latency communications (URLLC).

Description of Related Art

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., which may be referred to as a BS, next generation NodeB (gNB or gNodeB), TRP, etc.). A BS or DU may communicate with a set of UEs on downlink channels (e.g., for transmissions from a BS or DU to a UE) and uplink channels (e.g., for transmissions from a UE to a BS or DU).

These multiple access technologies have been adopted in various telecommunication standards to provide a common protocol that enables different wireless devices to communicate on a municipal, national, regional, and even global level. New radio (e.g., 5G NR) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Aspects of the present disclosure relate to wireless communications, and more particularly, to techniques for compact downlink control information (DCI) signaling design for example, for ultra-reliable low-latency communications (URLLC).

Certain aspects provide a method for wireless communication by a UE. The method generally includes receiving DCI from a BS. The DCI schedules at least one transmission. The DCI has a first DCI format that is compressed relative to a second DCI format. The first DCI format includes a CIF and/or a rate-matching indicator field. The method generally includes communicating with the BS based on the received DCI.

In some examples, the DCI schedules an ultra-reliable low-latency communications (URLLC) transmission.

In some examples, the second DCI format comprises a DCI format for enhanced mobile broadband (eMBB) communications.

In some examples, one or more fields of the first DCI format uses fewer bits than one or more fields of the second DCI format.

In some examples, the CIF comprises an indication of an index of a component carrier (CC) on which the at least one transmission is scheduled.

In some examples, the CIF consists of 1 or 2 bits.

In some examples, the method includes receiving radio resource control (RRC) signaling from the BS configuring the UE with a first CIF table for the first DCI format and a second CIF table for the second DCI format, different from the first CIF table.

In some examples, the DCI comprises an uplink DCI or a downlink DCI.

In some examples, the method includes transmitting in a cell on a physical uplink shared channel (PUSCH) with repetitions only within the cell when the CIF is not included in the DCI.

In some examples, the method includes transmitting the PUSCH with repetitions in different cells when the CIF is included in the DCI.

In some examples, the DCI includes multiple CIFs, each CIF indicating a different cell for a repetition of the scheduled transmission.

In some examples, the DCI is received in a physical downlink control channel (PDCCH), the at least one scheduled transmission comprises a (PDSCH) transmission, the rate-matching indicator field comprises an indication of whether the scheduled PDSCH was rate-matched around the PDCCH, and performing de-rate-matching for the PDSCH based on the indication.

In some examples, the rate-matching indicator field further comprises an indication of how the rate-matching was performed.

In some examples, different rate-matching patterns are indicated or configured for different PDSCH repetitions.

In some examples, the method includes receiving radio resource control (RRC) signaling configuring the UE for the different rate-matching for the PDSCH repetitions, and the de-rate-matching is performed further based on the RRC configuration.

In some examples, the UE is configured for different repetition-specific interpretations of the rate-matching indicator field.

In some examples, the method includes receiving RRC signaling configuring a first rate-matching table for PDSCH without repetition and a second rate-matching table, different than the first rate-matching table, for PDSCH with repetitions.

Certain aspects provide an apparatus for wireless communication, such as a UE. The apparatus generally includes means for receiving DCI from a BS. The DCI schedules at least one transmission. The DCI has a first DCI format that is compressed relative to a second DCI format. The first DCI format includes a CIF and/or a rate-matching indicator field. The apparatus generally includes means for communicating with the BS based on the received DCI.

Certain aspects provide an apparatus for wireless communication, such as a UE. The apparatus generally includes at least one processor coupled with a memory and configured to receive DCI from a BS. The DCI schedules at least one transmission. The DCI has a first DCI format that is compressed relative to a second DCI format. The first DCI format includes a CIF and/or a rate-matching indicator field. The at least one processor is configured to communicate with the BS based on the received DCI.

Certain aspects provide a computer readable medium having computer executable code stored for wireless communication. The computer readable medium generally includes code for receiving DCI from a BS. The DCI schedules at least one transmission. The DCI has a first DCI format that is compressed relative to a second DCI format. The first DCI format includes a CIF and/or a rate-matching indicator field. The computer readable medium generally includes code for communicating with the BS based on the received DCI.

Aspects of the present disclosure provide apparatus, methods, processing systems, and computer readable mediums for compact downlink control information (DCI) signaling design for example, for ultra-reliable low-latency communications (URLLC) that may be complementary to the operations by the UE and that may be performed, for example, by a BS.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

FIG. 3 is a table showing example fields of a normal downlink control information.

FIGS. 4A-4F are tables showing example fields of a fallback DCIs.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
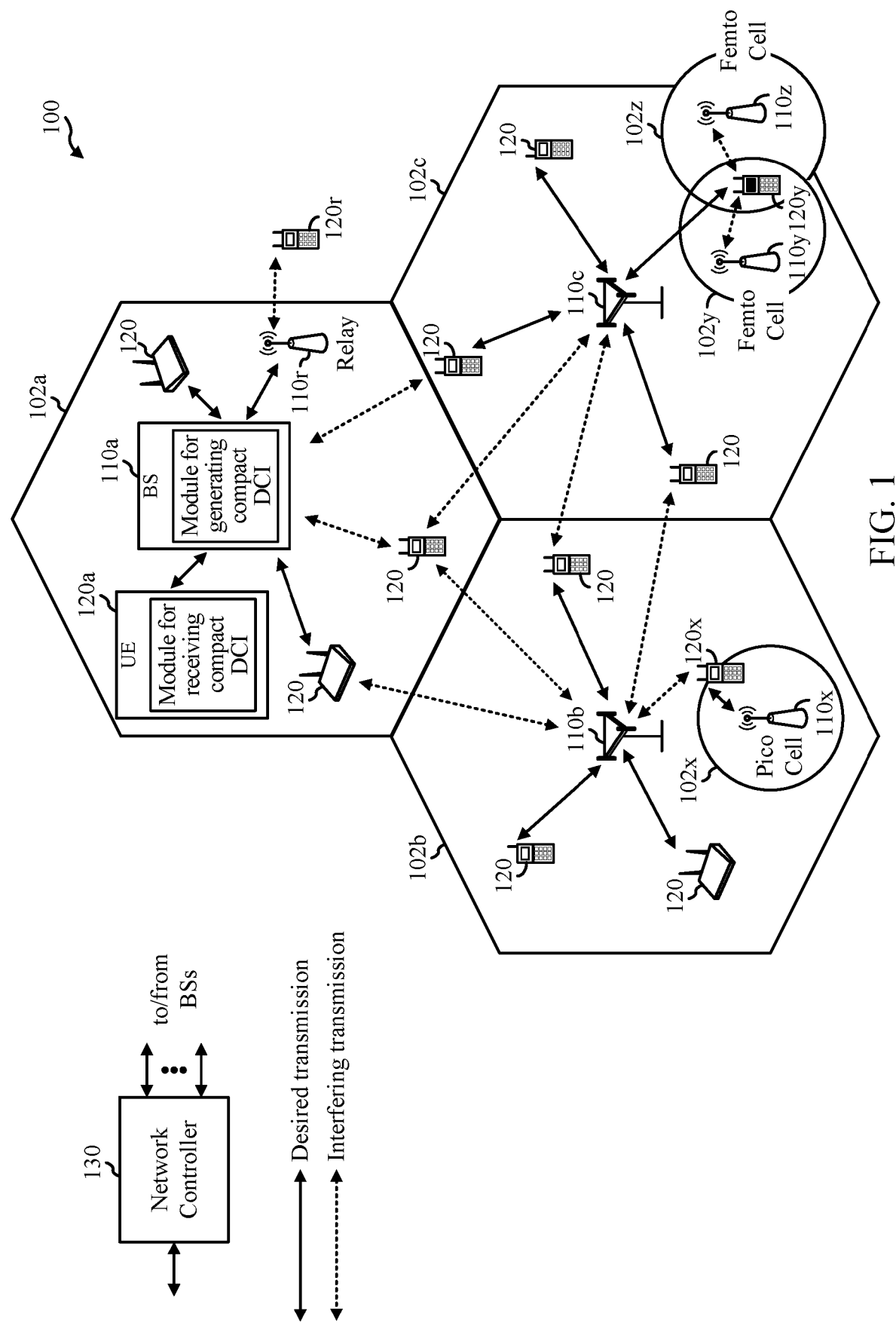
FIG. 1 is a block diagram conceptually illustrating an example telecommunications system, in accordance with certain aspects of the present disclosure.

Aspects of the present disclosure provide apparatus, methods, processing systems, and computer readable mediums for compact downlink control information (DCI) signaling design for example, for ultra-reliable low-latency communications (URLLC).

New radio (NR) access (e.g., 5G technology) may support various wireless communication services including enhanced mobile broadband (eMBB) targeting wide bandwidth (e.g., 80 MHz or beyond) and ultra-reliable low-latency communications (URLLC). These services may include latency and reliability requirements.

In order to increase the reliability of the physical downlink control channel (PDCCH), for example to meet the URLLC reliability requirements, a new compact downlink control information (DCI) format is provided having a reduced payload size and including information that may be used for URLLC operation, such as the carrier indicator field (CIF) and/or rate-matching indicator field.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as 3GPP Long Term Evolution (LTE), LTE-Advanced (LTE-A), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably.

A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). LTE and LTE-A are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). NR is an emerging wireless communications technology under development in conjunction with the 5G Technology Forum (5GTF).

The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

FIG. 1 illustrates an example wireless communication network 100 in which aspects of the present disclosure may be performed. For example, the wireless communication network 100 may be a 5g NR network supporting URLLC. A base station (BS) 110 in the wireless communication network 100 generates and transmits downlink control information (DCI) according to the signaling design provided herein for a compact DCI for URLLC. For example, the BS 110 may generate DCI having a compressed format and including a CIF and/or a rate-matching indicator field. The BS 110 transmits the DCI to a user equipment (UE) 120 in the wireless communication network 100 to schedule a transmission. As shown in FIG. 1, the BS 110a includes a module for generating compact DCI. For example, the module for generating compact DCI generates a DCI having a first DCI format that is compressed relative to a second DCI format and including the CIF and/or a rate-matching indicator field, in accordance with aspects of the present disclosure. The BS 110a sends the compact DCI to the UE 120a. As shown in FIG. 1, the UE 120a has a module for receiving compact DCI. For example, the module for sending compact DCI sends a DCI having a first DCI format that is compressed relative to a second DCI format and including the CIF and/or a rate-matching indicator field, in accordance with aspects of the present disclosure. The UE 120a communicates in accordance with the received DCI.

As illustrated in FIG. 1, the wireless communication network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a NB subsystem serving this coverage area, depending on the context in which the term is used. In NR systems, the term "cell" and BS, next generation NodeB (gNB or gNodeB), access point (AP), distributed unit (DU), carrier, or transmission reception point (TRP) may be used interchangeably. In some examples, a cell may not necessarily be stationary, and the geographic area of the cell may move according to the location of a mobile BS. In some examples, the BSs may be interconnected to one another and/or to one or more other BSs or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (e.g., 6 RBs), and there may be 1, 2, 4, 8, or 16 subbands for system bandwidth of 1.25, 2.5, 5, 10 or 20 MHz, respectively. In LTE, the basic transmission time interval (TTI) or packet duration is the 1 ms subframe. In NR, a subframe is still 1 ms, but the basic TTI is referred to as a slot. A subframe contains a variable number of slots (e.g., 1, 2, 4, 8, 16, . . . slots) depending on the subcarrier spacing. The NR RB may be 12 consecutive frequency subcarriers. NR may support a base subcarrier spacing of 15 KHz and other subcarrier spacing may be defined with respect to the base subcarrier spacing, for example, 30 kHz, 60 kHz, 120 kHz, 240 kHz, etc. The symbol and slot lengths scale with the subcarrier spacing. The CP length also depends on the subcarrier spacing.

NR may utilize OFDM with a CP on the uplink and downlink and include support for half-duplex operation using TDD. Beamforming may be supported and beam direction may be dynamically configured. MIMO transmissions with precoding may also be supported. In some examples, MIMO configurations in the DL may support up to 8 transmit antennas with multi-layer DL transmissions up to 8 streams and up to 2 streams per UE. In some examples, multi-layer transmissions with up to 2 streams per UE may be supported. Aggregation of multiple cells may be supported with up to 8 serving cells.

In some examples, access to the air interface may be scheduled. A scheduling entity (e.g., a BS) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In some examples, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

In FIG. 1, a solid line with double arrows indicates desired transmissions between a UE and a serving BS, which is a BS designated to serve the UE on the downlink and/or uplink. A finely dashed line with double arrows indicates potentially interfering transmissions between a UE and a BS.

Figure 2:
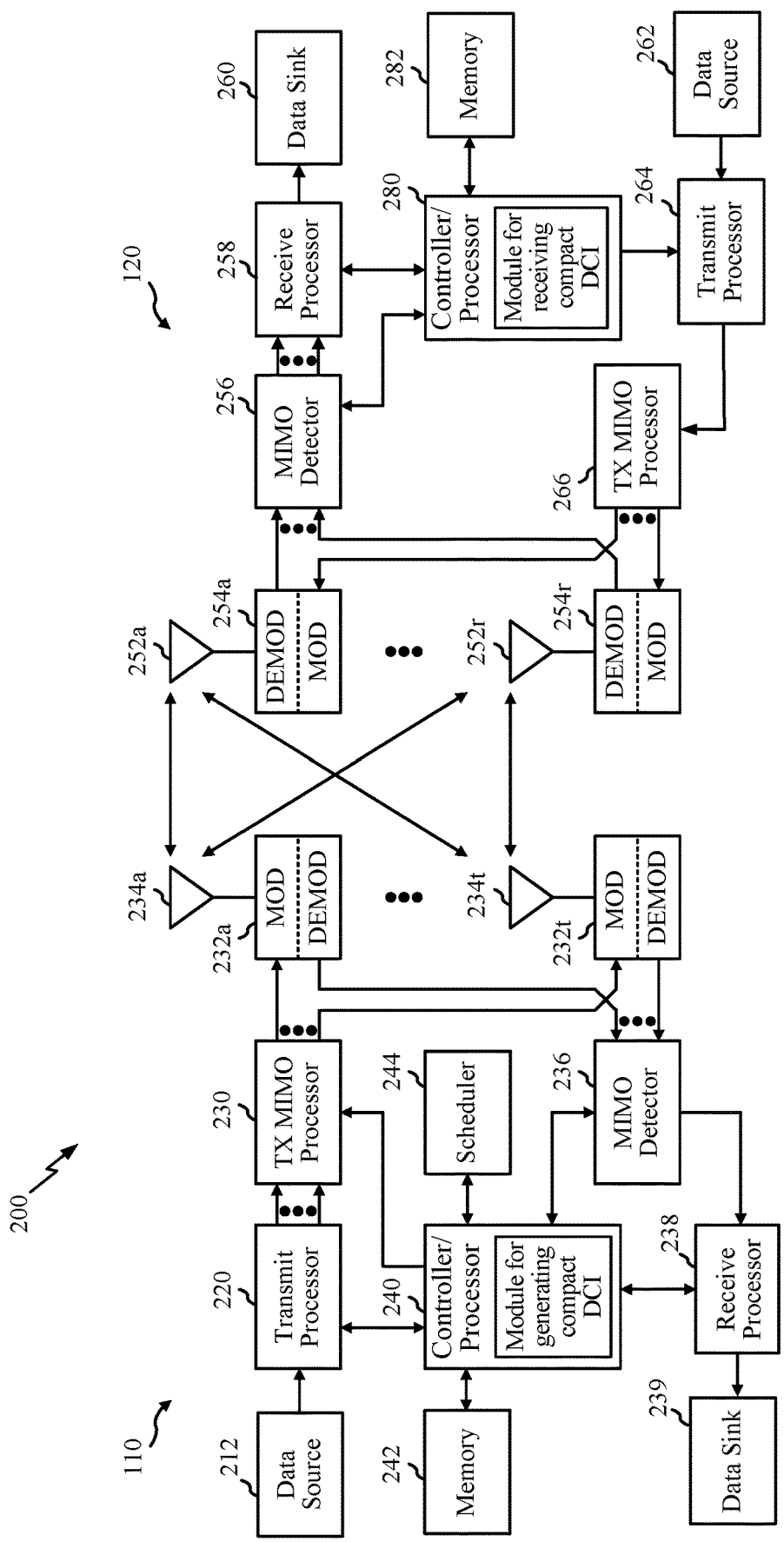
FIG. 2 is a block diagram conceptually illustrating a design of an example base station (BS) and user equipment (UE), in accordance with certain aspects of the present disclosure.

FIG. 2 illustrates example components of BS 110 and UE 120 (e.g., in the wireless communication network 100 of FIG. 1), which may be used to implement aspects of the present disclosure. For example, antennas 252, processors 266, 258, 264, and/or controller/processor 280 of the UE 120 and/or antennas 234, processors 220, 230, 238, and/or controller/processor 240 of the BS 110 may be used to perform the various techniques and methods described herein for a signaling design for a compact DCI for URLLC. As shown in FIG. 2, the controller/processor 240 of the BS 110 includes a module for generating compact DCI. For example, the module for generating compact DCI generates a DCI having a first DCI format that is compressed relative to a second DCI format and including the CIF and/or a rate-matching indicator field, in accordance with aspects of the present disclosure. The BS 110 sends the compact DCI to the UE 120, for example, via its transmit chain including one or more of the controller/processor 240, scheduler 244, memory 242, data source 212, transmit processor 220, TX MIMO processor 230, transceiver(s) (modulator(s)/demodulator(s)) 232a-232t, and antenna(s) 234a-234t. As shown in FIG. 2, the controller/processor 280 of the UE 120 has a module for receiving compact DCI. For example, the module for sending compact DCI sends a DCI having a first DCI format that is compressed relative to a second DCI format and including the CIF and/or a rate-matching indicator field, in accordance with aspects of the present disclosure. The UE 120 may receive the compact DCI via a receive chain including one or more of the controller/processor 280, data sink 260, receive processor 258, MIMO detector 256, transceiver(s) (demodulator(s)/modulator(s)) 242a-254r, and antenna(s) 252a-252r. The UE 120 communicates with the BS 110 in accordance with the received DCI.

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) 232a-232t. Each modulator 232 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 232a-232t may be transmitted via the antennas 234a-234t, respectively.

At the UE 120, the antennas 252a-252r may receive the downlink signals from the BS 110 and may provide received signals to the demodulators (DEMODs) in transceivers 254a-254r, respectively. Each demodulator 254 may condition (e.g., filter, amplify, downconvert, and digitize) a respective received signal to obtain input samples. Each demodulator may further process the input samples (e.g., for OFDM, etc.) to obtain received symbols. A MIMO detector 256 may obtain received symbols from all the demodulators 254a-254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the demodulators in transceivers 254a-254r (e.g., for SC-FDM, etc.), and transmitted to the base station 110. At the BS 110, the uplink signals from the UE 120 may be received by the antennas 234, processed by the modulators 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The controller/processor 240 and/or other processors and modules at the B S 110 may perform or direct the execution of processes for the techniques described herein. The memories 242 and 282 may store data and program codes for BS 110 and UE 120, respectively. A scheduler 244 may schedule UEs for data transmission on the downlink and/or uplink.

Example Compact DCI For URLLC

Aspects of the present disclosure provide apparatus, methods, processing systems, and computer readable mediums for compact downlink control information (DCI) signaling design. The compact DCI signaling design may be, for example, for ultra-reliable low-latency communications (URLLC).

New radio (NR) access (e.g., 5G NR technology) may support various wireless communication services including enhanced mobile broadband (eMBB) targeting wide bandwidth (e.g., 80 MHz or beyond) and URLLC. These services may include latency and reliability requirements.

Generally, two types of DCI messages described herein include a full DCI message (also referred to as normal DCI) and a fallback DCI message. In some examples, a normal DCI may be referred to as a Format 1_1 DCI. In some examples, the normal DCI includes the example fields shown in the table 300 illustrated in FIG. 3. As shown in the table 300, the example DCI Format 1_1 includes an identifier for DCI format, carrier indicator (0 or 3 bits), bandwidth part (BWP) indicator, frequency domain resource assignment, time domain resource assignment, VRB-to-PRB mapping (virtual resource block to physical resource block), PRB bundling size indicator, rate matching indicator (0, 1, or 2 bits), ZP (zero power) CSI-RS (channel state information reference signal) trigger, modulation and coding scheme (MCS), new data indicator, redundancy version (RV), hybrid automatic repeat request (HARQ) process number, downlink assignment index, TPC (transmit power control) command, physical uplink control channel (PUCCH) resource indicator, physical downlink shared channel (PDSCH)-to-HARQ feedback timing indicator, antenna port(s), transmission configuration indicator, sounding reference signal (SRS) request, code block group transmission information (CBGTI), CBG flushing out information (CBGFI), and demodulation reference signal (DMRS) initialization. The normal DCI fields may use the corresponding bit sizes shown in the table 300.

Fallback DCI may be used by the network (e.g., by a base station (BS), which maybe gNodeB (gNB)) when the transmission mode of the user equipment (UE) is unknown, when certain DCI formats are not supported by the UE, when the channel quality is poor, during RRC reconfiguration, etc. The fallback DCI message has a smaller payload compared to the full DCI message (e.g., the fallback DCI message is compressed with respect to the full DCI message). Some fields included in the full DCI message are absent in the smaller, fallback DCI message. In some examples, a fallback DCI may be referred to as a Format 1_0 DCI. Examples of fields that may be included in the fallback DCI are shown in the tables 400A-400F illustrated in FIGS. 4A-4F, respectively. In the tables 400A-400F, fields of the example normal DCI that are not present in the example fallback DCI are shown with strikethrough, and fields that are not present in the example normal DCI that are included in the example fallback DCI are shown as underlined. As shown in the table 300 and 400A-400F, the example fallback DCI Formats 1_0 are compressed with respect to the normal DCI, for example, containing fewer fields, fields with fewer bits, and/or fewer total bits. For example, a downlink beam indication may be semi-statically configured to be either present or absent in a full DCI message, and may be always omitted in a fallback DCI. Thus, when a field in the full DCI is unnecessary, the fallback DCI may be used to avoid transmitting the unnecessary field. The fallback DCI may also omit other fields. As shown in the tables 400A-400F, the fallback DCI may not include the carrier indicator field (CIF) and may not include the rate matching indicator field—while the full DCI may include the CIF and/or the rate matching indicator field.

Fallback DCI is often considered as a baseline for compact DCI design. In order to increase the reliability of the physical downlink control channel (PDCCH), for example to meet the URLLC reliability requirements, a new compact DCI format is provided. The new compact DCI format has a reduced payload size and includes information that may be used for URLLC operation. In some examples, the compact DCI is smaller than (e.g., compressed with respect to) a normal DCI and may be smaller than (e.g., compressed with respect to) a fallback DCI for NR eMBB. For example, the compact DCI for URLLC may be 10-12 bits smaller than a fallback eMBB DCI (e.g., the fallback eMBB DCI may be about 40 bits without cyclic redundancy check (CRC)). In some examples, the compact DCI for URLCC has reduced fields and/or reduced sizes of the fields, relative to the fallback DCI for eMBB. The reduced payload size may achieve the reduced number of bits for the compact DCI for URLLC. In some examples, the new compact DCI format for URLLC includes fields, such as a CIF and/or a rate-matching indicator field (e.g., while still having fewer total bits than the fallback DCI). These fields included in the compact DCI for URLCC may enable certain advanced URLLC operations.

Figure 5:
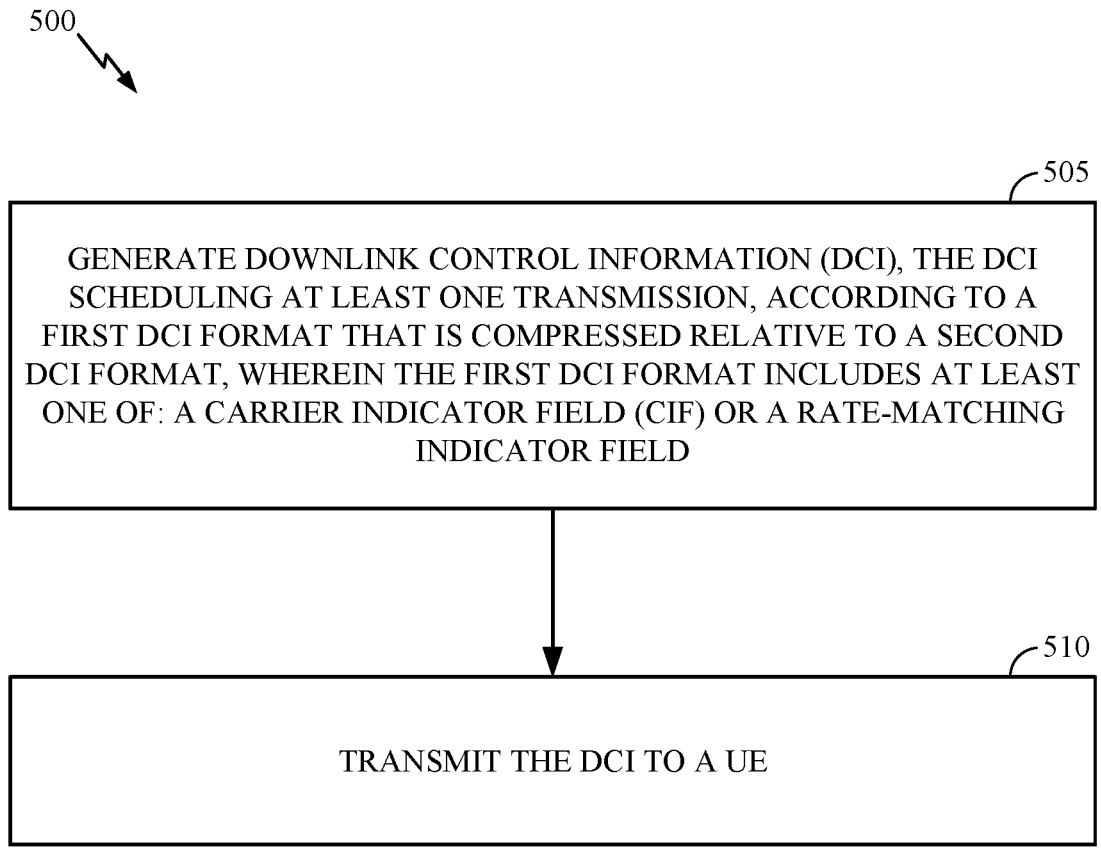
FIG. 5 is a flow diagram illustrating example operations for transmitting compact DCI signaling, in accordance with certain aspects of the present disclosure.

FIG. 5 is a flow diagram illustrating example operations 500 for wireless communication, in accordance with certain aspects of the present disclosure. Operations 500 can be performed by a BS (e.g., such as a BS 110a in the wireless communications network 100 illustrated in FIG. 1) for compact DCI signaling. Operations 500 may be implemented as software components that are executed and run on one or more processors (e.g., controller/processor 240 of FIG. 2). Further, the transmission and reception of signals by the BS in operations 500 may be enabled, for example, by one or more antennas (e.g., antennas 234 of FIG. 2). In certain aspects, the transmission and/or reception of signals by the BS may be implemented via a bus interface of one or more processors (e.g., controller/processor 240) obtaining and/or outputting signals.

Operations 500 begin, at 505, by generating DCI, scheduling at least one transmission (e.g., a URLLC transmission), according to a first DCI format. The first DCI format is compressed relative a second DCI format (e.g., a normal DCI format and/or a fallback eMBB DCI format). The first DCI format includes a CIF and/or a rate-matching indicator field. At 510, the BS transmits the DCI to a UE (e.g., such as a UE 120 in the wireless communication network 100 illustrated in FIG. 1).

According to certain aspects, the first DCI format is compressed relative to the second DCI format in that one or more fields of the first DCI format use fewer bits (or are omitted) than one or more fields of the second DCI format (that use more bits and/or a present). The compressed first DCI format may help to increase the reliability and/or reduce latency.

According to certain aspects, the first DCI format includes the CIF. The CIF indicates an index of a component carrier (CC) on which the at least one transmission is scheduled. In some examples, the CIF is a 1-bit field or a 2-bit field in the first DCI format. In some examples, regular eMBB DCI may have a 3-bit CIF field. The bitwidth of the CIF may be indicative of the number of CCs that can be scheduled. The CIF may enable cross-carrier scheduling for URLLC. To optimize URLLC system capacity, it is desirable that URLLC uplink and downlink can be transmitted at any time. However, for time division duplexing (TDD) systems, this may be infeasible due to the half-duplex nature. In order to allow scheduling data at any time without delay, carrier aggregation (CA) may be used for URLLC. In some examples, the CIF may be used to schedule data on TDD/FDD band from FDD based control channels, such that URLLC transmissions may be dynamically FDM'ed to reduce latency.

Figure 6:
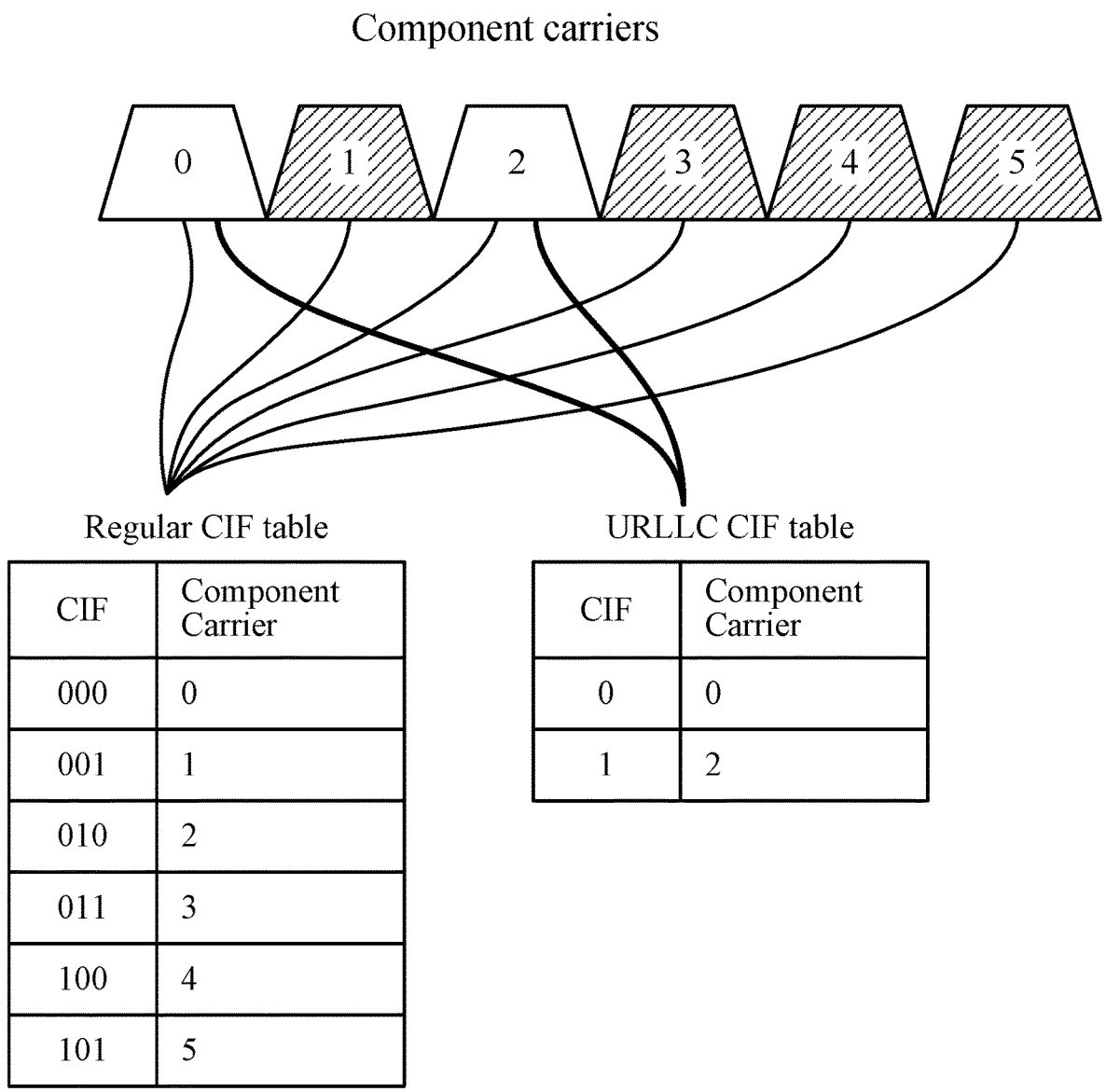
FIG. 6 illustrates example carrier indicator field (CIF) tables for example component carriers (CCs), in accordance with certain aspects of the present disclosure.

According to certain aspects, different CIF tables are used for URLCC and eMBB. In some examples, the BS maintains a first CIF table for the first DCI format (e.g., URLCC) and a second CIF table for the second DCI format (e.g., eMBB), different from the first CIF table. The first CIF table contains fewer entries than the second table to reduce the control signaling overhead for URLLC. Because eMBB and URLCC can have different CIF tables and different bitwidth CIF fields for URLLC and eMBB may be used, this implies that URLCC and eMBB may be configured with different numbers of CCs (i.e., have separate CC configurations for URLCC and eMBB). For example, as shown in FIG. 6, for six example CCs (0, 1, 2, 3, 4, 5), URLLC may be configured for CCs 0 and 2. All of the CCs may be configured with the regular CIF table (e.g., having 3-bits CIF), while the CCs 0 and 2 may also be configured with the URLLC CIF table (e.g., having 1-bit CIF). As shown in FIG. 6, the regular CIF table and the URLLC CIF table have different numbers of entries. The UE may monitor the compact DCI only when the CC is configured with URLLC processing capability. In some examples, for the CC2 configured with both CIF tables, cross-carrier scheduling configuration may be indicated by either the regular CIF table (e.g., 010) or the URLLC CIF table (e.g., 1), and have scheduling cell ID of 0. If configured only with regular CIF index but not the URLLC CIF index, then the UE monitors the compact DCI on that CC (where the DCI does not have any CIF field), but monitors the regular DCI (that can schedule eMBB traffic) in a different scheduling CC. On the other hand, if configured with a URLLC CIF index but not with regular CIF index, then the UE monitors the compact DCI in another scheduling CC with the CIF field contained in the compact DCI, but it monitors the regular DCI in this CC (e.g., CC 2) without the CIF field. If configured with both the URLLC CIF index and the regular CIF index (e.g., on CC2), then the UE monitors both the compact DCI and the regular DCI on another scheduling CC. For CC1; however, configured with only the regular CIF tables, the cross-carrier scheduling configuration is indicated by the regular CIF table (e.g., 001) and has scheduling cell ID of 0. For a cell without URLLC processing capability, it may be configured either with the regular CIF index, or nothing.

According to certain aspects, the CIF applies to both dynamic scheduling and semi-persistent scheduling (SPS). In some examples, the DCI generated at 305 schedules the at least one transmission dynamically or semi-persistently.

According to certain aspects, the CIF is included in both downlink DCI and uplink DCI. Alternatively, the CIF is included only in uplink DCI. In some examples, the CIF is not included in the downlink DCI and is included in the uplink DCI only if (e.g., when) the size (e.g., number of bits) of the uplink DCI, excluding the CIF, is at least a threshold number of bits, X bits (e.g., 1 or 2 bits), smaller than the size of the downlink DCI. In another alternative, the CIF is not included in uplink DCI and is also not included in the downlink DCI. Thus, the BS may generate the DCI, at 305, by including the CIF regardless of whether the DCI comprises an uplink or downlink DCI. The BS may generate the DCI, at 305, by including the CIF if (e.g., when) the DCI comprises an uplink DCI. The BS may generate the DCI, at 305, by not including the CIF if (e.g., when) the DCI comprises a downlink DCI. The BS may generate the DCI, at 305, by including the CIF if (e.g., when) the DCI comprises an uplink DCI and a size of the uplink DCI, excluding the CIF, is smaller than a size of a downlink DCI (or smaller by a threshold number of bits than the size of the downlink DCI). The BS may generate the DCI, at 305, by not including the CIF in the uplink DCI and not including the CIF in the downlink DCI.

According to certain aspects, eMBB (e.g., the second DCI format) and URLLC (e.g., the first DCI format) use different CIF configurations (e.g., include or do not include CIF in the DCI). In some examples, on the same component carrier, CIF can be configured for eMBB DCI and not configured URLCC DCI. In some examples, on the same CC, CIF can be configured for URLLC DCI and not configured for eMBB DCI. In some examples, on the same CC, CIF can be configured for both URLLC DCI and configured for eMBB DCI. In some examples, on the same CC, CIF may not be configured for either URLLC DCI or for eMBB DCI.

In some examples, the BS transmits the DCI, at 310, in physical downlink control channel (PDCCH). In some examples, the PDCCH is configured for transmission with repetitions. According to certain aspects, the PDCCH repetitions are transmitted only within the same cell if (e.g., when) the CIF is not included in the DCI (e.g., if CIF for URLLC PDCCH is not configured). According to certain aspects, the PDCCH repetitions are transmitted in different cells if (e.g., when) the CIF is included in the DCI (e.g., if CIF for URLLC PDCCH is configured). In some examples, the PDCCH repetitions on the different cells schedule the same transmission, for example the same physical downlink shared channel (PDSCH). For example, the PDCCH repetitions points to the same resources in the same cell for the scheduled transmission. In some examples, the different cells are under the same CIF operation.

In some examples, the DCI schedules PDSCH transmission. In some examples, the BS may transmit the PDSCH with repetitions (e.g., transmission time interval (TTI) bundling repetitions). According to certain aspects, the BS transmits the PDSCH only within the same cell if (e.g., when) the CIF is not included in the DCI (e.g., if CIF for URLLC PDCCH is not configured). According to certain aspects, the PDSCH repetitions are transmitted in different cells if (e.g., when) the CIF is included in the DCI (e.g., if CIF for URLLC PDCCH is configured). Multiple CIFs may be included in the same PDCCH and each CIF can indicate a cell on which a scheduled PDSCH repetition is located. Thus, in some examples, the BS generates the DCI, at 305, by including multiple CIFs in the DCI, each CIF indicating a different cell for a repetition of the scheduled transmission.

According to certain aspects, a different CIF table is used for repetitions. Each entry in the CIF table may contain multiple cell indices for scheduled repetitions on different cells. In some examples, the BS maintains a first CIF table for scheduling transmissions without repetitions and the BS maintains a second CIF table for scheduling transmission with repetitions. The second CIF table includes multiple (e.g., a plurality of) entries. Each entry may include multiple cell indices.

According to certain aspects, the rate-matching indicator may be a 1-bit field or a 2-bit field. For example, a 1-bit rate-matching indicator field may indicate whether a PDSCH was rate-matched around the PDCCH with the DCI scheduling the PDSCH. A 2-bit rate-matching indicator may indicate how the rate-matching is performed (e.g., in addition to indicating whether PDSCH was rate-matched around the PDCCH). The BS transmits the scheduled PDSCH with or without rate-matching around the PDCCH according to the indication.

In some examples, the bitwidth (i.e., number of bits) of the rate matching field may be different between the compact DCI and regular DCI. In this case, the rate-matching pattern tables may be separately configured for the regular DCI and the compact DCI, for example similarly to the CIF tables discussed above with respect to FIG. 6. For the compact DCI, the rate-matching tables may be more tailored towards URLLC DL transmission. For example, the compact DCI may be transmitted anywhere in the slot, whereas the regular DCI may be constrained within the first few (e.g., 3) OFDM symbols of the slot. In the first few ODFM symbols, other DCIs (e.g., for different UEs) may be scheduled. Therefore, the BS may indicate a finer rate-matching pattern (e.g., using 2 bits) using the regular DCI. However, when the compact DCI comes in the middle of a slot, it is less likely for the BS to schedule another DCI. Thus, the UE may only rate match around the PDCCH carrying the compact DCI. In this case, 1-bit (e.g., to indicate whether or not to rate-match) suffices for the BS to indicate the rate-matching pattern.

According to certain aspects, for PDSCH with repetitions, different transmissions of the repeated PDSCH may have different rate-matching configurations (and/or indication). In some examples, different rate-matching patterns can be configured by a repetition-specific radio resource control (RRC) configuration (e.g., via RRC signaling). The BS may maintain different rate-matching tables for PDSCH transmission with and without repetition. For example, the BS may maintain a first rate-matching table for PDSCH without repetition and maintain a second rate-matching table, different than the first rate-matching table, for PDSCH with repetitions. In some examples, the UE can be configured for repetition-specific interpretation of the rate-matching indication. For example, if (e.g., when) PDSCH transmission with repetitions is configured, a different RRC table may be used for the rate-matching pattern of different PDSCH transmissions.

Figure 7:
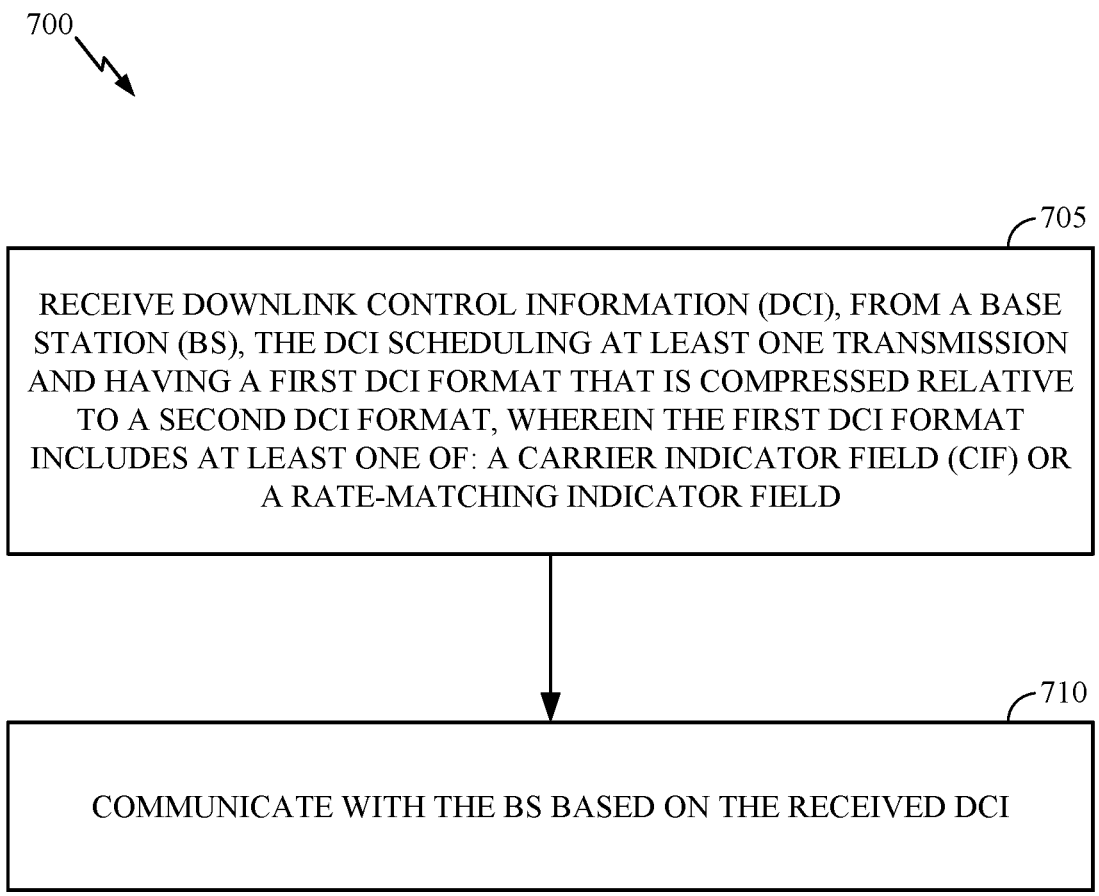
FIG. 7 is a flow diagram illustrating example operations for receiving compact DCI signaling, in accordance with certain aspects of the present disclosure.

FIG. 7 is a flow diagram illustrating example operations 700 for receiving wireless communications, in accordance with certain aspects of the present disclosure. The operations 700 may be performed by a UE (e.g., such as the UE 120a in the wireless communication network 100 illustrated in FIG. 1). The operations 700 may be complimentary operations by the UE to the operations 500 performed by the BS. Operations 700 may be implemented as software components that are executed and run on one or more processors (e.g., controller/processor 280 of FIG. 2). Further, the transmission and reception of signals by the UE in operations 700 may be enabled, for example, by one or more antennas (e.g., antennas 252 of FIG. 2). In certain aspects, the transmission and/or reception of signals by the UE may be implemented via a bus interface of one or more processors (e.g., controller/processor 280) obtaining and/or outputting signals.

The operations 700 begin, at 705, by receiving DCI, from a BS (e.g., such as the BS 110a in the wireless communication network 100 illustrated in FIG. 1). The DCI schedules (e.g., contains a grant or scheduling information) at least one transmission (e.g., a URLLC transmission). The DCI has a first DCI format that is compressed relative to a second DCI format (e.g., a normal or fallback eMBB DCI). The first DCI format includes a CIF and/or a rate-matching indicator field. At 710, the UE communicates with the BS based on the received DCI. For example, the UE transmits or receives (including, e.g., monitoring, processing, decoding, and/or demodulating) the scheduled at least one transmission according to the information in the CIF and/or the rate-matching indicator field.

According to certain aspects, the UE maintains a first CIF table for the first DCI format and maintains a second CIF table for the second DCI format, different from the first CIF table. In some examples, the UE receives RRC signaling from the BS configuring the first CIF table for the first DCI format and the second CIF table for the second DCI format. As discussed above with respect to FIG. 5 and FIG. 6, the first CIF table may contain fewer entries than the second table to reduce the control signaling overhead for URLLC. In some examples, the UE monitors the compact DCI with CIF and rate-matching fields. The UE may monitor the compact DCI only when the CC is configured with URLLC processing capability. For example, for CCs configured with both CIF tables (e.g., CC2 in FIG. 6), cross-carrier scheduling configuration may be indicated by either the regular CIF table or the URLLC CIF table. For example, if configured with both the URLLC CIF index and the regular CIF index (e.g., on CC2), then the UE monitors both the compact DCI and the regular DCI on another scheduling CC. If configured only with regular CIF index but not the URLLC CIF index, then the UE monitors the compact DCI on that CC (where the DCI does not have any CIF field), but monitors the regular DCI (that can schedule eMBB traffic) in a different scheduling CC. On the other hand, for CCs configured with a URLLC CIF index but not with regular CIF index, then the UE monitors the compact DCI in another scheduling CC with the CIF field contained in the compact DCI, but it monitors the regular DCI in these CCs without the CIF field. For CCs (e.g., CC1 in FIG. 6) configured with only the regular CIF tables, the cross-carrier scheduling configuration is indicated by the regular CIF table. For a cell without URLLC processing capability, it may be configured either with the regular CIF index, or nothing.

According to certain aspects, the UE transmits in a cell on a physical uplink shared channel (PUSCH) with repetitions only within the cell if (e.g., when) the CIF is not included in the DCI. According to certain aspects, the UE transmits the PUSCH with repetitions in different cells if (e.g., when) the CIF is included in the DCI. In some examples, the DCI includes multiple CIFs, each CIF indicating a different cell for a repetition of the scheduled transmission.

In some examples, the UE receives the DCI in a PDCCH. The rate-matching indicator field indicates whether a scheduled PDSCH is rate-matched around the scheduling PDCCH. According to certain aspects, the UE determines the rate-matching pattern for the PDSCH based on the indication. As discussed above, the bitwidth (i.e., number of bits) of the rate matching field may be different between the compact DCI and regular DCI, and the rate-matching pattern tables may be separately configured for the regular DCI and the compact DCI. As discussed above, the rate-matching pattern for the regular DCI may be finer granularity than the compact DCI for URLLC.

As discussed above, the DCI may schedule PDSCH transmission. In some examples, the BS may transmit the PDSCH with repetitions (e.g., TTI bundling repetitions). PDSCH may be scheduled/transmitted only within the same cell if (e.g., when) the CIF is not included in the DCI (e.g., if CIF for URLLC PDCCH is not configured), and the PDSCH repetitions are transmitted in different cells if (e.g., when) the CIF is included in the DCI (e.g., if CIF for URLLC PDCCH is configured). Multiple CIFs may be included in the same PDCCH and each CIF can indicate a cell on which a scheduled PDSCH repetition is located. The UE may be scheduled (e.g., configured or indicated) with different rate-matching patterns for different PDSCH repetitions. The UE may receive RRC signaling from the BS configuring different rate-matching tables for PDSCH transmission with and without repetition. For example, the UE is configured with a first rate-matching table for PDSCH without repetition and a configured with a second rate-matching table, different than the first rate-matching table, for PDSCH with repetitions. The UE performs de-rate-matching for a received PDSCH in accordance with RRC configuring and the rate-matching indication. A different CIF table may be used for repetitions. Each entry in the CIF table may contain multiple cell indices for scheduled repetitions on different cells. In some examples, the UE maintains a first CIF table for scheduling transmissions without repetitions and the UE maintains a second CIF table for scheduling transmission with repetitions. The second CIF table includes multiple (e.g., a plurality of) entries. Each entry may include multiple cell indices.

Figure 8:
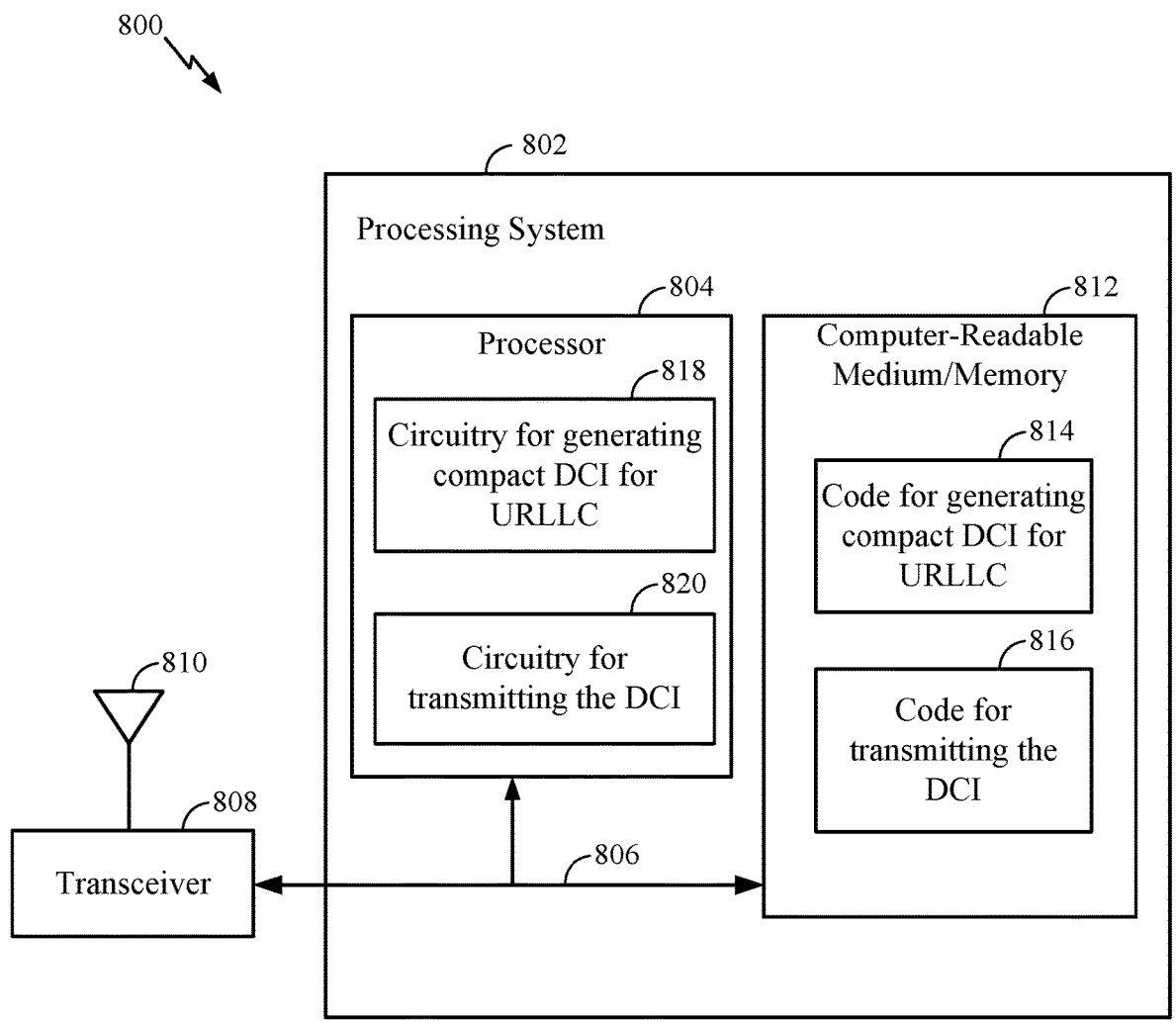
FIG. 8 illustrates a communications device that may include various components configured to perform operations for the techniques disclosed herein, in accordance with certain aspects of the present disclosure.

FIG. 8 illustrates a communications device 800 that may include various components (e.g., corresponding to means-plus-function components) configured to perform operations for the techniques disclosed herein, such as the operations 500 illustrated in FIG. 5. The communications device 800 includes a processing system 802 coupled to a transceiver 808. The transceiver 808 is configured to transmit and receive signals for the communications device 800 via an antenna 810, such as the various signals, including, for example, the compact DCI, PDCCH, PDSCH, and/or PUSCH as described herein. The processing system 802 may be configured to perform processing functions for the communications device 800, including processing signals received and/or to be transmitted by the communications device 800.

Figure 9:
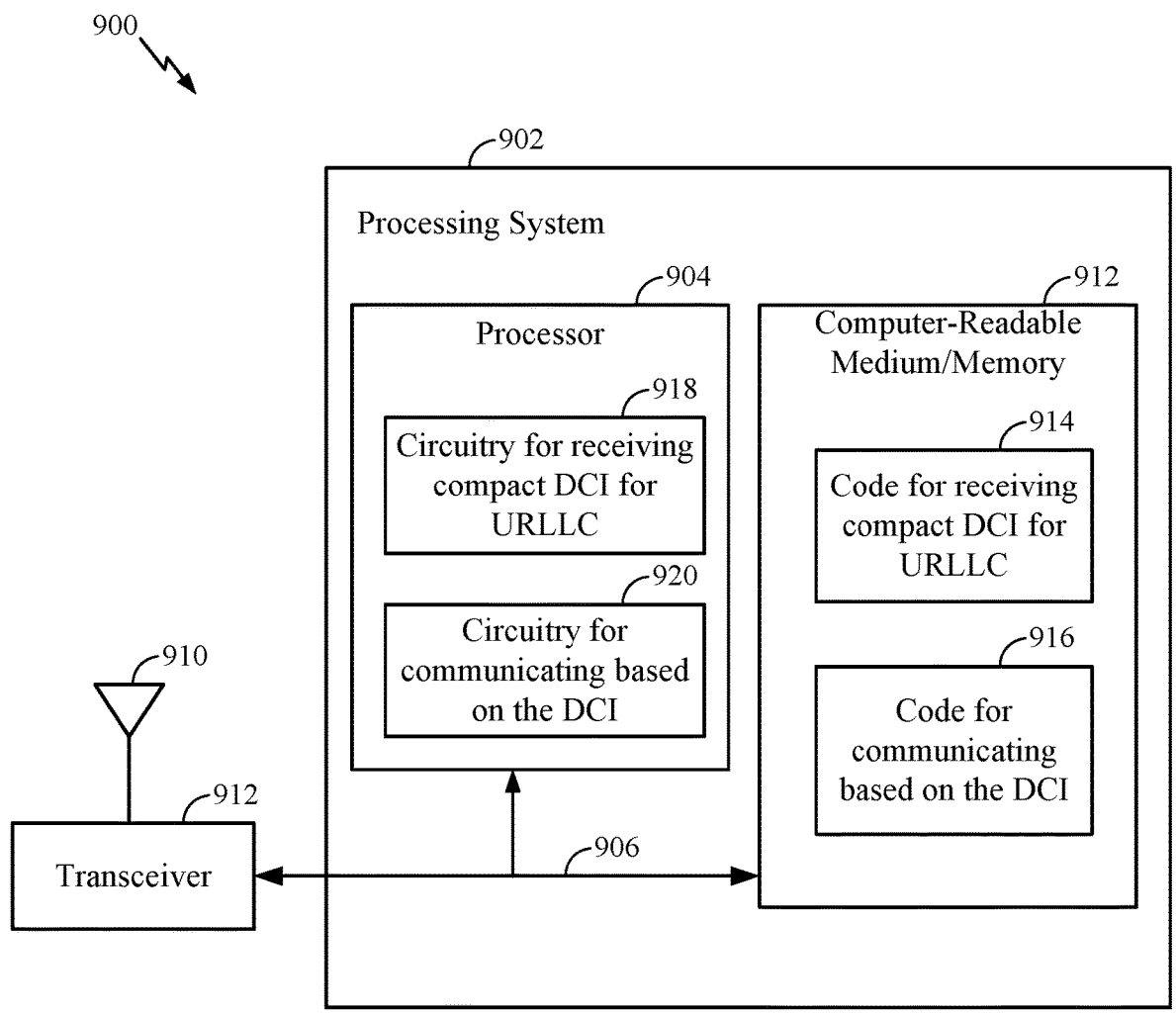
FIG. 9 illustrates a communications device that may include various components configured to perform operations for the techniques disclosed herein, in accordance with certain aspects of the present disclosure.

The processing system 802 includes a processor 804 coupled to a computer-readable medium/memory 812 via a bus 806. In certain aspects, the computer-readable medium/memory 812 is configured to store instructions (e.g., computer executable code) that when executed by the processor 804, cause the processor 804 to perform the operations 500 illustrated in FIG. 5, or other operations for performing the various techniques discussed herein for compact DCI signaling design for URLLC. In certain aspects, computer-readable medium/memory 8012 stores code 814 for generating compact DCI for URLLC, for example code for generating DCI scheduling at least one transmission and having a first DCI format including a CIF and/or a rate-matching indictor, in accordance with aspects of the present disclosure; and code 816 for transmitting the DCI. The processor 804 includes circuitry 818 for generating compact DCI for URLLC, for example circuitry for generating DCI scheduling at least one transmission and having a first DCI format including a CIF and/or a rate-matching indictor, in accordance with aspects of the present disclosure; and circuitry 820 for transmitting the DCI FIG. 9 illustrates a communications device 900 that may include various components (e.g., corresponding to means-plus-function components) configured to perform operations for the techniques disclosed herein, such as the operations 900 illustrated in FIG. 7. The communications device 900 includes a processing system 902 coupled to a transceiver 908. The transceiver 908 is configured to transmit and receive signals for the communications device 900 via an antenna 910, such as the various signals, including, for example, the compact DCI, PDCCH, PDSCH, and/or PUSCH as described herein. The processing system 902 may be configured to perform processing functions for the communications device 900, including processing signals received and/or to be transmitted by the communications device 90.

The processing system 902 includes a processor 904 coupled to a computer-readable medium/memory 912 via a bus 906. In certain aspects, the computer-readable medium/memory 912 is configured to store instructions (e.g., computer executable code) that when executed by the processor 904, cause the processor 904 to perform the operations 900 illustrated in FIG. 7, or other operations for performing the various techniques discussed herein for compact DCI signaling design for URLLC. In certain aspects, computer-readable medium/memory stores code 912 for receiving compact DCI for URLLC, for example code for receiving DCI scheduling at least one transmission and having a first DCI format including a CIF and/or a rate-matching indictor, in accordance with aspects of the present disclosure; and code 914 for communicating based on the DCI.

Aspects of the present disclosure may provide a compact DCI that uses fewer bits than another DCI, such a regular or fallback DCI for eMBB. The compact DCI may improve reliability of PDCCH which may help meet the requirements for URLLC service. The compact DCI may include fields, such as a CIF and rate-matching indicator field to enable certain URLLC operations. In turn, the functioning of the transceiver (e.g., processor) can be improved.

Example Embodiments

Embodiment 1

A method for wireless communications by a base station (BS), comprising generating downlink control information (DCI), scheduling at least one transmission, according to a first DCI format that is compressed relative to a second DCI format, wherein the first DCI format includes at least one of: a carrier indicator field (CIF) or a rate-matching indicator field; and transmitting the DCI to a user equipment (UE).

Embodiment 2

The method of Embodiment 1, wherein the DCI schedules an ultra-reliable low-latency communications (URLLC) transmission.

Embodiment 3

The method of Embodiments 1 or 2, wherein the second DCI format comprises a DCI format for enhanced mobile broadband (eMBB) communications.

Embodiment 4

The method of any of Embodiments 1-3, wherein one or more fields of the first DCI format uses fewer bits than one or more fields of the second DCI format.

Embodiment 5

The method of any of Embodiments 1-4, wherein the CIF comprises an indication of an index of a component carrier (CC) on which the at least one transmission is scheduled.

Embodiment 6

The method of any of Embodiments 1-5, wherein the CIF consists of 1 or 2 bits.

Embodiment 7

The method of any of Embodiments 1-6, further comprising maintaining a first CIF table for the first DCI format and a second CIF table for the second DCI format, different from the first CIF table.

Embodiment 8

The method of any of Embodiments 1-7, wherein the DCI schedules the at least one transmission dynamically or semi-persistently.

Embodiment 9

The method of any of Embodiments 1-8, wherein generating the DCI comprises including the CIF regardless if the DCI comprises an uplink or downlink DCI.

Embodiment 10

The method of any of Embodiments 1-8, wherein generating the DCI comprises including the CIF if the DCI comprises an uplink DCI; and not including the CIF if the DCI comprises a downlink DCI.

Embodiment 11

The method of any of Embodiments 1-8, wherein generating the DCI comprises including the CIF if the DCI comprises an uplink DCI and if a size of the uplink DCI, excluding the CIF, is smaller than a size of a downlink DCI.

Embodiment 12

The method of any of Embodiments 1-8, wherein the first DCI format includes a first CIF and the second DCI format does not include CIF; the first DCI format does not include CIF and the second DCI format includes a second CIF; the first DCI format includes the first CIF and the second DCI format includes the second CIF; or the first and second DCI formats do not include CIF.

Embodiment 13

The method of any of Embodiments 1-12, wherein the DCI is transmitted in a cell on a physical downlink control channel (PDCCH); and the PDCCH is repeated only within the cell if the CIF is not included in the DCI.

Embodiment 14

The method of any of Embodiments 1-13, wherein the PDCCH is repeated on different cells if the CIF is included in the DCI.

Embodiment 15

The method of Embodiment 14, wherein the repeated PDCCH schedules the same transmission.

Embodiment 16

The method of Embodiments 14 or 15, wherein the different cells are under a same CIF operation.

Embodiment 17

The method of any of Embodiments 1-16, further comprising transmitting in a cell on a physical downlink shared channel (PDSCH) with repetitions only within the cell if the CIF is not included in the DCI.

Embodiment 18

The method of Embodiment 17, further comprising transmitting the PDSCH with repetitions in different cells if the CIF is included in the DCI.

Embodiment 19

The method of Embodiment 18, wherein generating the DCI comprises including multiple CIFs, each CIF indicating a different cell for a repetition of the scheduled transmission.

Embodiment 20

The method of Embodiments 18 or 19, further comprising maintaining a first CIF table for scheduling transmissions without repetitions; and maintaining a second CIF table for scheduling transmission with repetitions, the second CIF table comprising a plurality of entries, each entry comprising multiple carrier indices.

Embodiment 21

The method of any of Embodiments 1-20, further comprising rate-matching a physical downlink shared channel (PDCCH) around a physical downlink control channel (PDCCH) including the DCI, wherein the rate-matching indicator field comprises an indication of the PDSCH is rate-matched around the PDCCH.

Embodiment 22

The method of any of Embodiments 1-21, further comprising maintaining a first rate-matching table for PDSCH without repetition and a second rate-matching table, different than the first rate-matching table, for PDSCH with repetitions.

Embodiment 23

The method of any of Embodiments 1-22, wherein the rate-matching indicator field further comprises an indication of how the rate-matching is performed.

Embodiment 24

The method of any of Embodiments 1-22, wherein different rate-matching patterns are scheduled or configured for different PDSCH repetitions.

Embodiment 25

The method of Embodiment 24, wherein the different rate-matching patterns are configured by radio resource control (RRC) signaling.

Embodiment 26

The method of Embodiments 24, wherein the different rate-matching patterns are configured by configuring the UE for different repetition-specific interpretations of the rate-matching indicator field in the DCI.

Embodiment 27

An apparatus for wireless communications comprising means for generating DCI scheduling at least one transmission, according to a first DCI format that is compressed relative to a second DCI format, the first DCI format includes a CIF and/or a rate-matching indicator field; means for transmitting the DCI to a UE; and means for performing any of the BS operations described herein.

Embodiment 28

An apparatus for wireless communications comprising at least one processor coupled with a memory and configured to generate DCI scheduling at least one transmission, according to a first DCI format that is compressed relative to a second DCI format, the first DCI format including a CIF and/or a rate-matching indicator field; and transmit the DCI to a UE.

Embodiment 29

A computer readable medium having computer executable code stored thereon for wireless communications comprising code for generating DCI scheduling at least one transmission, according to a first DCI format that is compressed relative to a second DCI format, the first DCI format including a CIF and/or a rate-matching indicator field; and code for transmitting the DCI to a UE.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 7 and FIG. 8.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communications by a user equipment (UE), comprising:
   receiving radio resource control (RRC) signaling, from a base station (BS), configuring the UE with
     a 0, 1, 2, or 3 bit carrier indicator field (CIF) and
     a 0, 1, or 2 bit rate-matching indicator field
   for at least a first downlink control information (DCI) format, from a set of DCI formats including 0, 1, 2, and 3 bits CIFs and 0, 1, and 2 bit rate-matching indicator fields,
   wherein a total number of bits for a CIF for the first DCI format is based on whether the first DCI format is for scheduling an uplink transmission or for scheduling a downlink transmission;
   monitoring a DCI of the first DCI format from the BS, wherein the DCI schedules the uplink or downlink transmission; and
   communicating with the BS based on the DCI.

2. The method of claim 1,
   wherein the DCI of the first DCI format schedules an ultra-reliable low-latency communications (URLLC) transmission.

3. The method of claim 2,
   wherein the set of DCI formats includes a second DCI format for scheduling enhanced mobile broadband (eMBB) communications, and
   wherein the first DCI format scheduling the URLLC transmission includes fewer bits than the second DCI format for scheduling eMBB communications.

4. The method of claim 3,
   wherein the second DCI format includes the CIF, the rate-matching indicator field, or both.

5. The method of claim 1,
   wherein the first DCI format includes the 2 bit CIF, the 2 bit rate-matching indicator field, or both.

6. The method of claim 1,
   wherein the CIF comprises an indication of an index of a component carrier (CC) on which the uplink or downlink transmission is scheduled.

7. The method of claim 1,
wherein the RRC signaling from the BS configures the UE with
a first CIF table for the first DCI format and
a second CIF table for a second DCI format, the second CIF table being different from the first CIF table.

8. The method of claim 7, wherein:
the first CIF table for the first DCI format configures a first CIF index of a scheduled cell, and
the second CIF table for the second DCI format configures a second CIF index of the scheduled cell.

9. The method of claim 1, further comprising
transmitting in a cell on a physical uplink shared channel (PUSCH) with repetitions only within the cell in response to the CIF not being included in the DCI.

10. The method of claim 9, further comprising
transmitting the PUSCH with repetitions in different cells in response to the CIF being included in the DCI.

11. The method of claim 1,
wherein the DCI includes multiple CIFs, each CIF indicating a different cell for a repetition of the scheduled uplink or downlink transmission.

12. The method of claim 1, wherein:
the schedule transmission is the downlink transmission,
the DCI is received in a physical downlink control channel (PDCCH);
the scheduled downlink transmission comprises a physical downlink shared channel (PDSCH) transmission;
the 1-bit or 2-bit rate-matching indicator field comprises an indication of whether the scheduled PDSCH was rate-matched around the PDCCH; and
performing de-rate-matching for the PDSCH based on the indication.

13. The method of claim 12,
wherein the rate-matching indicator field further comprises an indication of how the rate-matching was performed.

14. The method of claim 12,
wherein different rate-matching patterns are indicated or configured for different PDSCH repetitions.

15. The method of claim 14,
wherein the RRC signaling from the BS configures the UE for the different rate-matching for the different PDSCH repetitions,
wherein the de-rate-matching is performed further based on the RRC signaling.

16. The method of claim 14,
wherein the UE is configured for different repetition-specific interpretations of the rate-matching indicator field.

17. The method of claim 12,
wherein the RRC signaling configures
a first rate-matching table for PDSCH without repetition and
a second rate-matching table, different than the first rate-matching table, for PDSCH with repetitions.

18. An apparatus for wireless communications, comprising:
at least one processor coupled with a memory, the memory comprising code executable by the at least one processor to cause the apparatus to:
receive radio resource control (RRC) signaling, from a base station (BS), configuring the apparatus with
a 0, 1, 2, or 3 bit carrier indicator field (CIF) and
a 0, 1, or 2 bit rate-matching indicator filed
for at least a first downlink control information (DCI) format, from a set of DCI formats including
0, 1, 2, and 3 bits CIFs and
0, 1, and 2 bit rate-matching indicator fields,
wherein a total number of bits for a CIF for the first DCI format is based on whether the first DCI format is for scheduling an uplink transmission or for scheduling a downlink transmission;
monitor a DCI of the first DCI format from the BS,
wherein the DCI schedules the uplink or downlink transmission; and
communicate with the BS based on the DCI.

19. The apparatus of claim 18,
wherein DCI of the first DCI format schedules an ultra-reliable low-latency communications (URLLC) transmission.

20. The apparatus of claim 19,
wherein the set of DCI formats includes a second DCI format for scheduling enhanced mobile broadband (eMBB) communications, and
wherein the first DCI format scheduling the URLLC transmission includes fewer bits than the second DCI format for scheduling eMBB communications.

21. The apparatus of claim 20,
wherein the second DCI format includes the CIF, the rate-matching indicator field, or both.

22. The apparatus of claim 20,
wherein the RRC signaling from the BS configures the UE with a first CIF table for the first DCI format and a second CIF table for the second DCI format, the second CIF table being different from the first CIF table.

23. The apparatus of claim 18,
wherein the first DCI format includes the 2 bit CIF, the 2 bit rate-matching indicator field, or both.

24. The apparatus of claim 18,
wherein the CIF comprises an indication of an index of a component carrier (CC) on which the uplink or downlink transmission is scheduled.

25. The apparatus of claim 18, the memory comprising code executable by the at least one processor to cause the apparatus to
transmit in a cell on a physical uplink shared channel (PUSCH) with repetitions only within the cell in response to the CIF not being included in the DCI.

26. The apparatus of claim 25, the memory comprising code executable by the at least one processor to cause the apparatus to
transmit the PUSCH with repetitions in different cells in response to the CIF being included in the DCI.

27. An apparatus for wireless communication, comprising:
means for receiving radio resource control (RRC) signaling, from a base station (BS), configuring the apparatus with
a 0, 1, 2, or 3 bit carrier indicator field (CIF) and
a 0, 1, or 2 bit rate-matching indicator field,
for at least a first downlink control information (DCI) format, from a set of DCI formats including
0, 1, 2, and 3 bits CIFs and
0, 1, and 2 bit rate-matching indicator fields,
wherein a total number of bits for a CIF for the first DCI format is based on whether the first DCI format is for scheduling an uplink transmission or scheduling a downlink transmission;
means for monitoring a DCI of the first DCI format from the BS, wherein the DCI schedules the uplink or downlink transmission and means for communicating with the BS based on the DCI.

28. A non-transitory computer readable medium storing computer executable code thereon for wireless communication, comprising:

code for receiving radio resource control (RRC) signaling, from a base station (BS), configuring a user equipment (UE) with a 0, 1, 2, or 3 bit carrier indicator field (CIF) and a 0, 1, or 2 bit rate-matching indicator field, for at least a first downlink control information (DCI) format, from a set of DCI formats including 0, 1, 2, and 3 bits CIFs and 0, 1, and 2 bit rate-matching indicator fields;

wherein a total number of bits for a CIF for the first DCI format is based on whether the first DCI format is for scheduling an uplink transmission or scheduling a downlink transmission;

code for monitoring a DCI of the first DCI format from the BS, wherein the DCI schedules the uplink or downlink transmission; and code for communicating with the BS based on the DCI.

* * * * *